(12) United States Patent
Gao et al.

(10) Patent No.: US 10,600,811 B2
(45) Date of Patent: Mar. 24, 2020

(54) TFT ARRAY SUBSTRATE AND LCD

(71) Applicant: Wuhan China Star Optoelectronics Technology Co., Ltd., Wuhan (CN)

(72) Inventors: Ling Gao, Wuhan (CN); Xiaojiang Yu, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/097,276

(22) PCT Filed: Sep. 19, 2018

(86) PCT No.: PCT/CN2018/106390
§ 371 (c)(1),
(2) Date: Oct. 29, 2018

(87) PCT Pub. No.: WO2019/200836
PCT Pub. Date: Oct. 24, 2019

(65) Prior Publication Data
US 2019/0326331 A1 Oct. 24, 2019

(30) Foreign Application Priority Data
Apr. 20, 2018 (CN) .......................... 2018 1 0362233

(51) Int. Cl.
*H01L 27/12* (2006.01)
*G02F 1/1362* (2006.01)

(52) U.S. Cl.
CPC .... *H01L 27/1218* (2013.01); *G02F 1/136277* (2013.01); *G02F 2001/136222* (2013.01)

(58) Field of Classification Search
CPC .... G02F 1/1335; G02F 1/1333; G02F 1/1339; G02F 1/136277; G02F 2001/136222; H01L 27/1218
(Continued)

(56) References Cited

U.S. PATENT DOCUMENTS 6,057,898 A * 5/2000 Itoh ..................... G02F 1/13336
349/153
6,946,679 B2 * 9/2005 Miwa .................... G02F 1/1333
257/257

(Continued)

FOREIGN PATENT DOCUMENTS

CN 2610361 Y 4/2004
CN 102738403 A 10/2012
(Continued)

*Primary Examiner* — Charles S Chang
(74) *Attorney, Agent, or Firm* — Leong C. Lei (57) ABSTRACT

The invention provides a TFT array substrate and LCD panel. The TFT array substrate adopts a Notch design, with a base substrate disposed with a groove at one end. The base substrate comprises a functional area and a peripheral area located outside the functional area, and the planarization layer on the base substrate has a first portion corresponding to the functional area, wherein the first portion adjacent to the groove is provided with at least one pit, and the depth of the pit is smaller than the thickness of the first portion. When the TFT array substrate and the CF substrate are assembled, after the LC is injected between TFT array substrate and CF substrate, the LC accumulation generated in the first portion of the planarization layer near the groove during diffusion is in the pit, thereby making the LC layer thickness uniform and improved quality of LCD panel.

10 Claims, 10 Drawing Sheets

(58) Field of Classification Search
USPC .......................................... 349/149–152, 158
See application file for complete search history.

(56) References Cited

U.S. PATENT DOCUMENTS

| | | | |
|---|---|---|---|
| 8,471,987 B2* | 6/2013 | Miyamoto | G02F 1/13394 349/114 |
| 2002/0187575 A1* | 12/2002 | Maruyama | H01L 51/524 438/33 |
| 2008/0272367 A1 | 11/2008 | Cok | |
| 2013/0328051 A1* | 12/2013 | Franklin | H01L 29/786 257/59 |
| 2014/0176895 A1* | 6/2014 | Park | G02F 1/1339 349/153 |
| 2015/0062515 A1 | 3/2015 | Tomioka | |
| 2019/0050094 A1* | 2/2019 | Zeng | H04M 1/0279 |

FOREIGN PATENT DOCUMENTS

| | | |
|---|---|---|
| CN | 103403892 A | 11/2013 |
| CN | 204389840 U | 6/2015 |
| CN | 105247408 A | 1/2016 |
| CN | 105652526 A | 6/2016 |
| CN | 106848080 A | 6/2017 |
| CN | 107731868 A | 2/2018 |
| CN | 108508667 A | 9/2018 |

* cited by examiner

TFT ARRAY SUBSTRATE AND LCD

BACKGROUND OF THE INVENTION

1. Field of the Invention

The present invention relates to the field of display, and in particular to a thin film transistor (TFT) array substrate and liquid crystal display (LCD).

2. The Related Arts

In the field of display technology, a panel display device such as liquid crystal display (LCD) has gradually replaced a cathode ray tube (CRT) display device. The LCD has many advantages such as thinness, power saving, no radiation, and so on, and has been widely used.

Most of the LCD devices on the market are backlight-type LCD devices, which comprise an LCD panel and a backlight module. Generally, an LCD panel comprises a color filter (CF) substrate, a thin film transistor (TFT) array substrate, a liquid crystal (LC) layer sandwiched between the CD substrate and the TFT array substrate, and a sealant frame. The working principle of the LCD panel is to place LC molecules in two parallel glass substrates disposed with many vertical and horizontal thin wires between the two glass substrates, and the LC molecules are controlled to change direction by energizing the wires or not to refract the light of the backlight module to produce an image screen.

Figure 1:
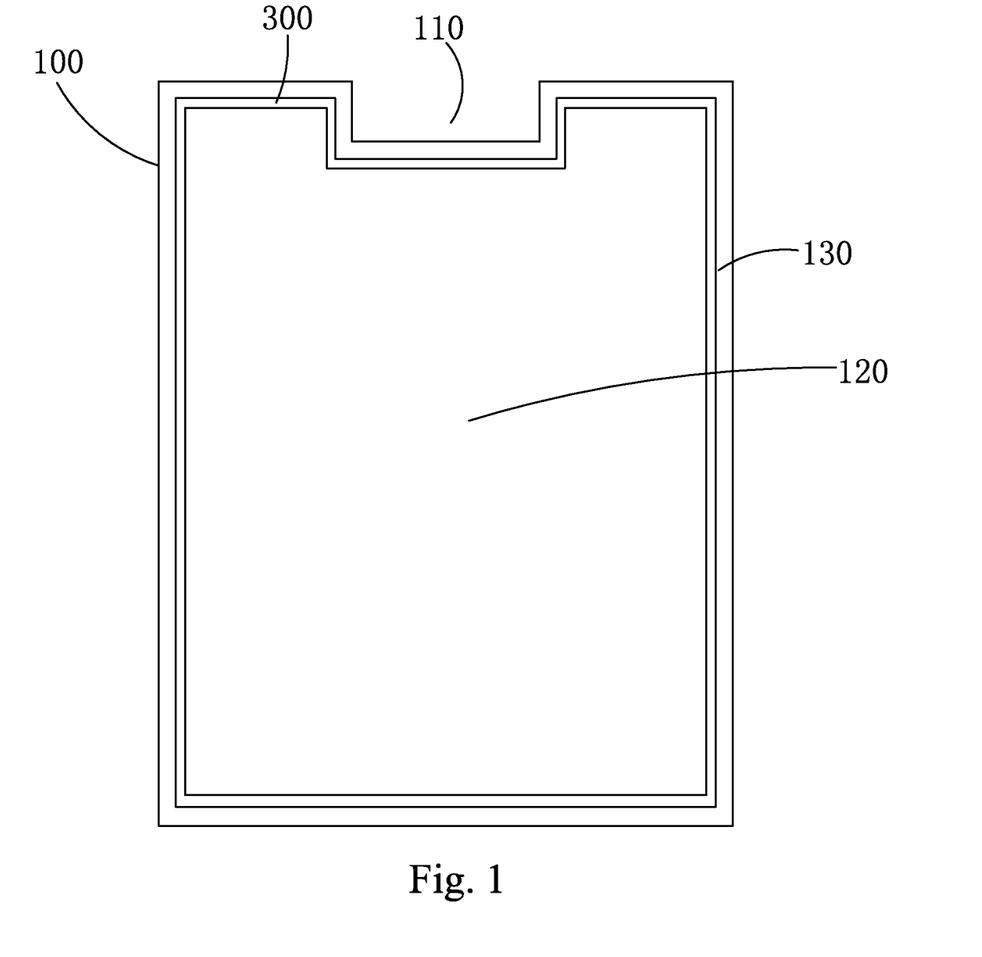
FIG. 1 is a top view showing the TFT array substrate and sealant of the display panel adopting Notch design.

With the continuous development of display technology, high screen-to-body ratio mobile display devices are increasingly favored by consumers. To further increase the screen-to-body ratio of the display panel, a display panel using a Notch (concave) design has emerged. As shown in FIG. 1, a TFT array substrate 100 of a display panel using a Notch design is provided with a groove 110 at one end thereof, and the TFT array substrate 100 comprises a functional area 120 and a peripheral area 130 located outside the functional area 120, the sealant 300 for attaching CF substrate and the TFT array substrate 100 is disposed corresponding to the peripheral area 130. Therefore, the sealant 300 is also recessed toward the inner side of the TFT array substrate 100 as the groove 110, resulting in accumulation of LC in the functional area 120 near the groove 110 during diffusing after the LC is injected between the TFT array substrate 100 and the CF substrate, so that the LC layer of the LCD panel has a large thickness therein, thereby forming a poor display (Mura), affecting the product quality.

SUMMARY OF THE INVENTION

The object of the present invention is to provide a TFT array substrate, applicable to an LCD panel to make the thickness of the LC layer of the LCD panel uniform to improve the product quality of the LCD panel.

Another object of the present invention is to provide an LCD panel, having uniform thickness of the LC layer and high product quality.

To achieve the above object, the present invention provides a TFT array substrate, which comprises: a base substrate and a planarization layer disposed on the base substrate;

one end of the base substrate being provided with a groove, the base substrate comprising a functional area and a peripheral area located outside the functional area; the planarization layer has a first portion corresponding to the functional area of the base substrate; a portion of the first portion adjacent to the groove being disposed with at least one pit;

the pit having a depth less than the thickness of the first portion.

Wherein, in a cross-section of the planarization layer, area occupied by the pits per unit area where the first portion is disposed with the pits gradually increases towards the direction of the groove.

Wherein, the number of pits per unit area in region of the first portion adjacent to the groove is greater than the number of pits per unit area in region of the first portion away from the groove.

Wherein, an inner diameter of the pit in the region of the first portion adjacent the groove is larger than an inner diameter of the pit in the region of the first portion away from the groove.

Wherein, the first portion is disposed with N rows of pits adjacent to the groove, and distance between the plurality of pits and the groove in each row of pits is the same, wherein N is a positive integer;

spacing between two adjacent pits in each row of pits is equal.

Wherein, $3 \leq N \leq 5$.

Wherein, the depth of the pit is 0.5-3 um.

Wherein, the end of the base substrate disposed with the groove comprises a first sidewall, a second sidewall, a third sidewall, a fourth sidewall and a fifth sidewall, sequentially connected; the first sidewall and the fifth sidewall are in the same plane, the second sidewall, the third sidewall, and the fourth sidewall collectively form the groove.

The present invention also provides an LCD panel, which comprises: a TFT array substrate and a CF substrate disposed opposite to each other, and an LC layer disposed between the TFT array substrate and the CF substrate;

the TFT array substrate being the above-mentioned TFT array substrate;

a portion of the LC layer being housed in the pit.

The present invention provides the following advantages: the TFT array substrate provided by the present invention adopts a Notch design, with a base substrate disposed with a groove at one end. The base substrate comprises a functional area and a peripheral area located outside the functional area, and the planarization layer on the base substrate has a first portion corresponding to the functional area, wherein the first portion adjacent to the groove is provided with at least one pit, and the depth of the pit is smaller than the thickness of the first portion. When the TFT array substrate and the CF substrate are assembled, after the LC is injected between the TFT array substrate and the CF substrate, the LC accumulation generated in the first portion of the planarization layer near the groove during LC diffusion will be in the pit, thereby making the thickness of the LC layer more uniform and improved product quality. The LCD panel provided by the invention has uniform LC layer and high product quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 2:
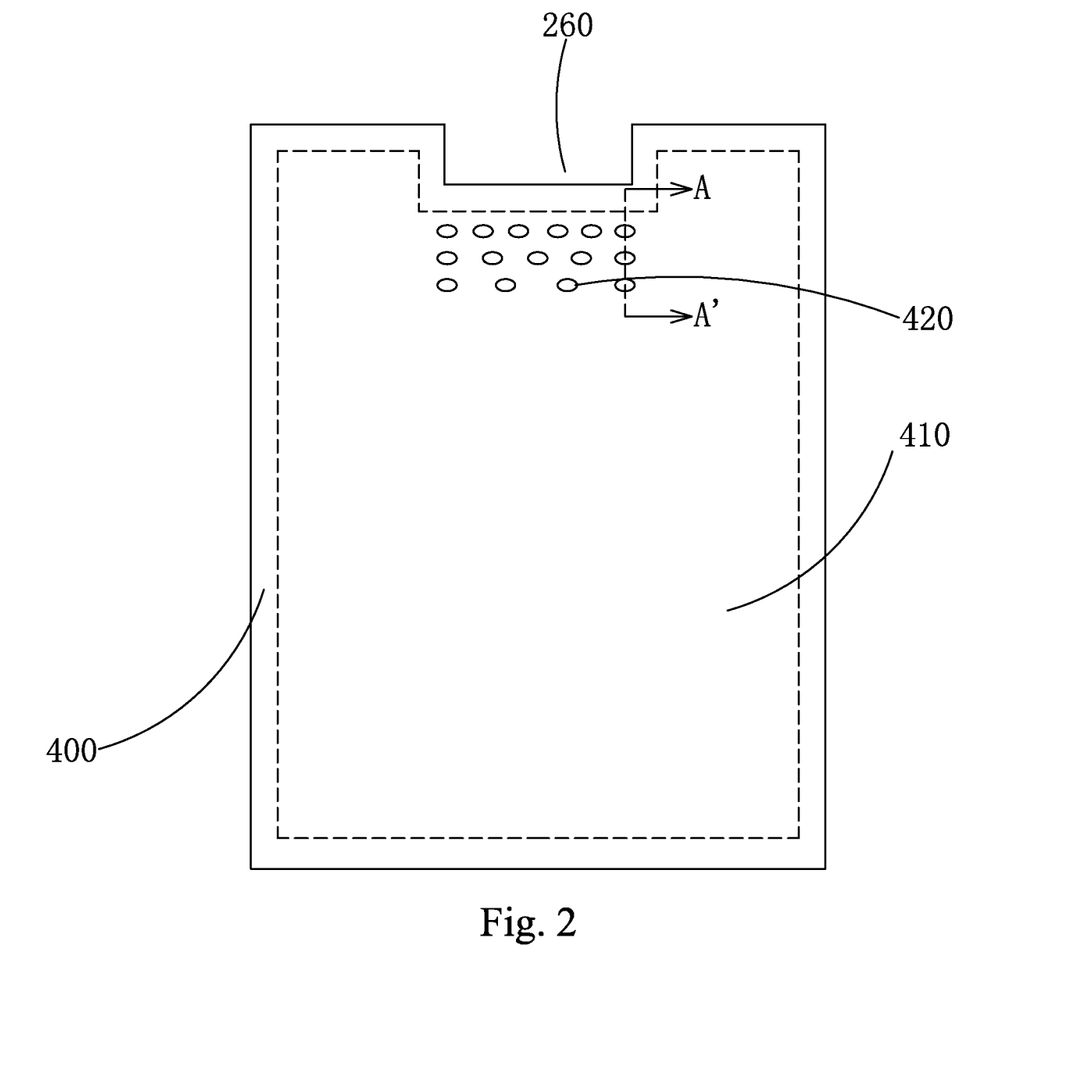
FIG. 2 is a top view showing the TFT array substrate of the first embodiment of the present invention.
Figure 4:
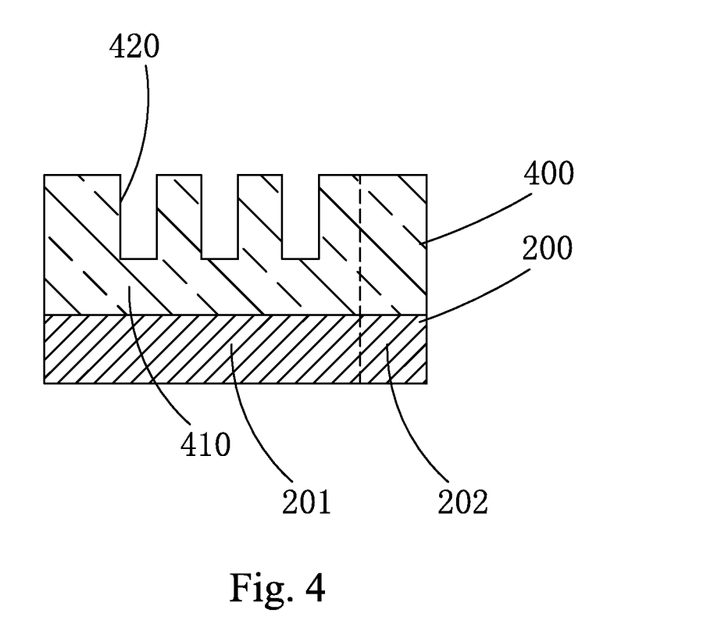
FIG. 4 is a cross-sectional view along A-A' in FIG. 2.

Refer to FIG. 2 and FIG. 4. The TFT array substrate of the first embodiment of the present invention comprises a base substrate 200 and a planarization layer 400 disposed on the base substrate 200.

Figure 3:
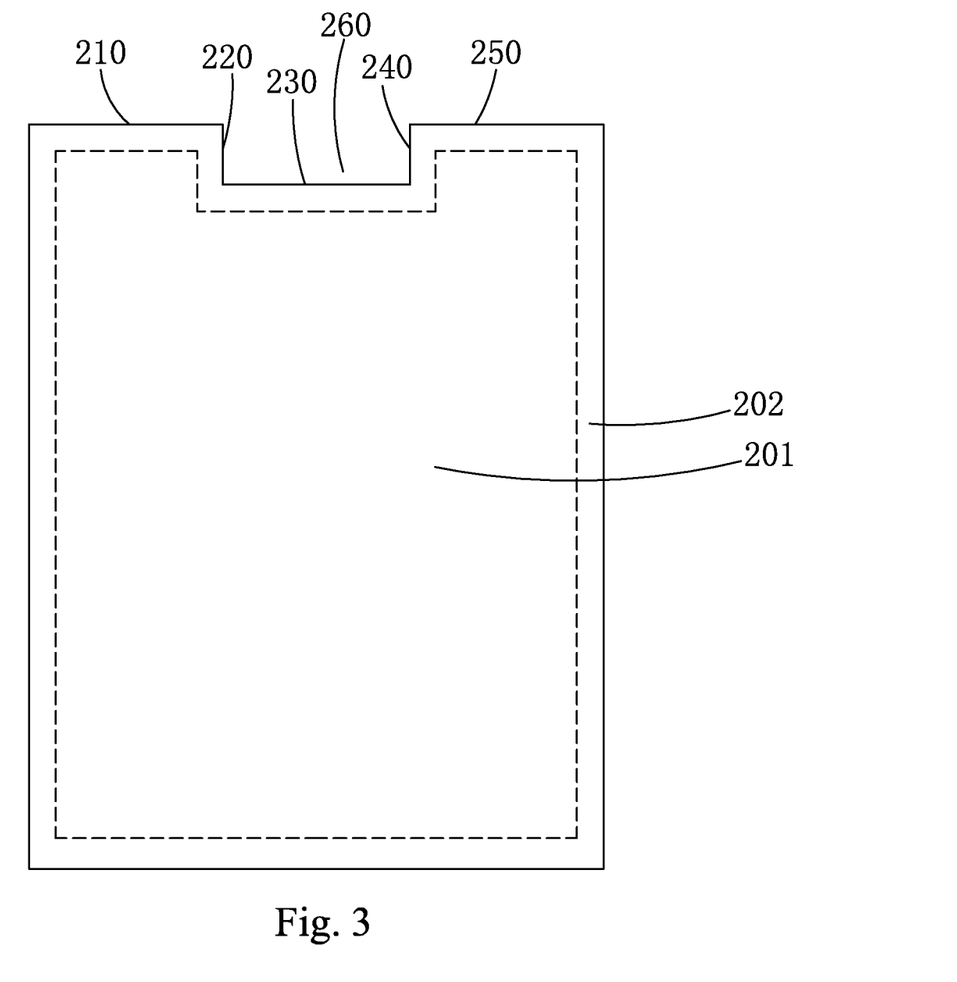
FIG. 3 is a top view showing the base substrate of the TFT array substrate of the present invention.

The TFT array substrate adopts the Notch design. Refer to FIG. 3. One end of the base substrate 200 is provided with a groove 260. The base substrate 200 comprises a functional area 201 and a peripheral area 202 located outside the functional area 201. Refer to FIG. 2 and FIG. 4. The planarization layer 400 has a first portion 410 corresponding to the functional area 201 of the base substrate 200; a portion of the first portion 410 adjacent to the groove 260 is disposed with at least one pit 420. The pit 420 has a depth less than the thickness of the first portion 410.

Specifically, the TFT array substrate of the present invention further comprises a plurality of TFT devices (not shown) between the base substrate 200 and the planarization layer 400, and a plurality of pixel electrodes (not shown) disposed on the planarization layer 400. The TFT devices and the pixel electrodes are both disposed in the function area 201. Generally, the function area 201 corresponds to the active area of the display panel, and the peripheral area 202 corresponds to the non-active area of the display panel (for example, area coated with sealant, area disposed with driving circuit). Each of the pixel electrodes is connected to the drain of the corresponding TFT device through a via penetrating the planarization layer 400, and the pit 420 can be fabricated while fabricating the via connecting the pixel electrode and the TFT device.

Specifically, in a cross-section of the planarization layer 400, the area occupied by the pits 420 per unit area where the first portion 410 is disposed with the pits 420 gradually increases towards the direction of the groove 260.

Moreover, as shown in FIG. 2 and FIG. 4, in the TFT array substrate of the embodiment of the present invention, the number of pits 420 per unit area in the region of the first portion 410 adjacent to the groove 260 is greater than the number of pits 420 per unit area in the region of the first portion 410 away from the groove 260. The first portion 410 is disposed with N rows of pits 420 adjacent to the groove 260, and distance between the plurality of pits 420 and the groove 260 in each row of pits 420 is the same, wherein N is a positive integer; the spacing between two adjacent pits 420 in each row of pits 420 is equal.

Specifically, in the TFT array substrate of the embodiment of the present invention, the inner diameter of the pit 420, the spacing between two adjacent pits 420 in each row of pits 420, and the spacing between two adjacent rows of pits 420 can be adjusted according to the application. Preferably, $3 \leq N \leq 5$. That is, the number of rows of pits 420 disposed in the first portion 410 adjacent to the groove 260 is 3, 4, or 5. As shown in FIG. 2 and FIG. 4, N=3.

Preferably, the depth of the pit 420 is 0.5-3 um.

Specifically, the end of the base substrate 200 disposed with the groove 260 comprises a first sidewall 210, a second sidewall 220, a third sidewall 230, a fourth sidewall 240 and a fifth sidewall 250, sequentially connected; the first sidewall 210 and the fifth sidewall 250 are in the same plane; the second sidewall 220, the third sidewall 230, and the fourth sidewall 240 collectively form the groove.

Moreover, referring to FIG. 3, the first sidewall 210 is perpendicular to the second sidewall 220, the second sidewall 220 is perpendicular to the third sidewall 230, and the third sidewall 230 is perpendicular to the fourth sidewall 240.

Specifically, the peripheral area 202 is configured to be disposed with a sealant between the TFT array substrate and the CF substrate after the TFT array substrate and the CF substrate are paired and assembled, so that the inner side of the sealant and the edge of the functional area 201 coincide.

It should be noted that when an LCD panel is fabricated by using the TFT array substrate of the first embodiment of the present invention, the first embodiment of the TFT array substrate of the present invention is paired with the CF substrate and assembled. A sealant frame is formed in corresponding peripheral area 202 between the first embodiment of the TFT array substrate and the CF substrate, and the inner side of the sealant coincides with the edge of the functional area 201. LC is injected into the inner side of the sealant between the TFT array substrate and the CF substrate to form an LC layer. Because the base substrate 200 is disposed with the groove 260, the portion of the sealant corresponding to the groove 260 is also bent toward the inner side of the TFT array substrate as the groove 260. Therefore, during the diffusion process, the LC accumulates in the first portion 410 of the planarization layer 400 corresponding to the functional area 201 adjacent to the groove 260. The closer to the groove 260, the more LC is accumulated. In the first embodiment of the TFT array substrate of the present invention, the region of the first portion 410 of planarization layer 400 corresponding to the functional area 201 adjacent to the groove 260 is disposed with at least one pit 420. Specifically, the number of pits 420 per unit area in the region of the first portion 410 adjacent to the groove 260 is greater than the number of pits 420 per unit area in the region of the first portion 410 away from the groove 260. As such, in a cross-section of the planarization layer 400, the area occupied by the pits 420 per unit area where the first portion 410 is disposed with the pits 420 gradually increases towards the direction of the groove 260. Therefore, the accumulated LC can be accommodated by the pits 420, so that the portion of the LC layer of the final LCD panel is accommodated in the pit 420, the thickness of the LC layer is more uniform, and compared with the prior art, it is possible to eliminate the display defect at the edge of the functional area due to the Notch design, thereby improving the product quality.

Figure 5:
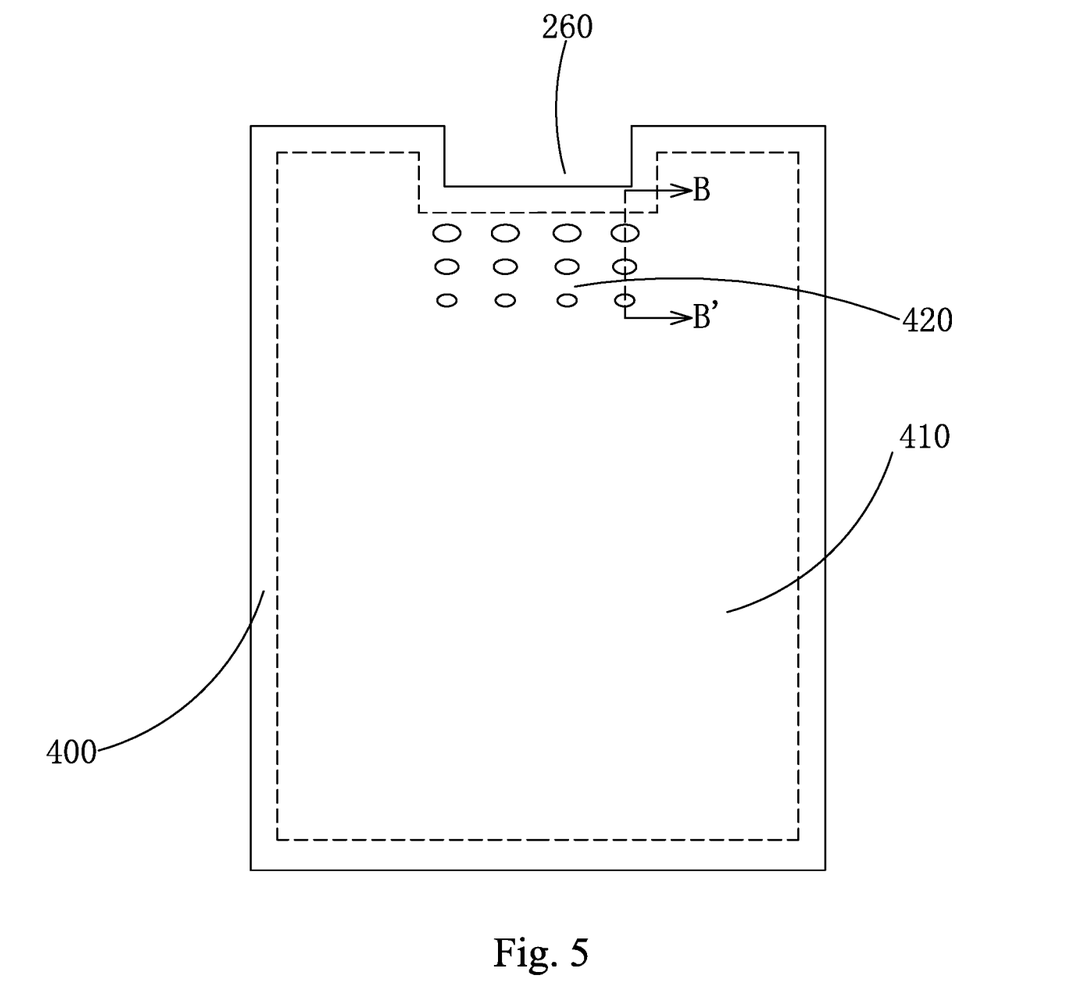
FIG. 5 is a top view showing the TFT array substrate of the second embodiment of the present invention.
Figure 6:
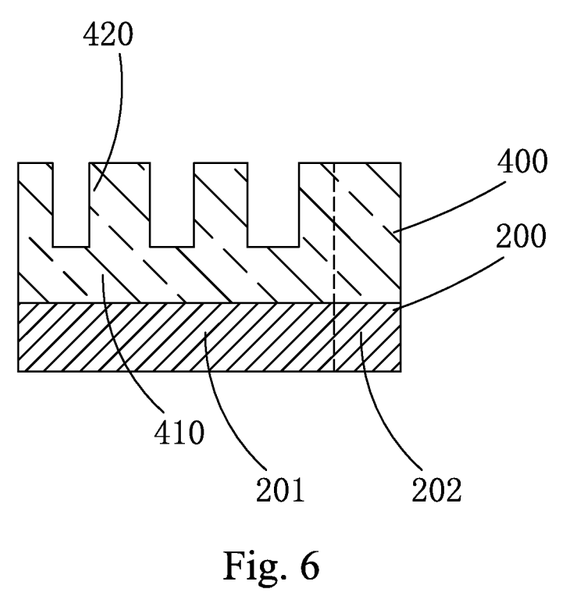
FIG. 6 is a cross-sectional view along B-B' in FIG. 5.

Refer to FIG. 5 and FIG. 6, as well as FIG. 3. The second embodiment of the TFT array substrate differs from the first embodiment in that, the inner diameter of the pit 420 in the region of the first portion 410 adjacent the groove 260 is larger than the inner diameter of the pit 420 in the region of the first portion 410 away from the groove 260. The remaining is the same as the first embodiment and will not be repeated herein.

It should be noted that in the second embodiment of the TFT array substrate of the present invention, the region of the first portion 410 of planarization layer 400 corresponding to the functional area 201 adjacent to the groove 260 is disposed with at least one pit 420 and the inner diameter of the pit 420 in the region of the first portion 410 adjacent the groove 260 is larger than the inner diameter of the pit 420 in the region of the first portion 410 away from the groove 260. As such, in a cross-section of the planarization layer 400, the area occupied by the pits 420 per unit area where the first portion 410 is disposed with the pits 420 gradually increases towards the direction of the groove 260. Therefore, the accumulated LC can be accommodated by the pits 420, so that the portion of the LC layer of the final LCD panel is accommodated in the pit 420, the thickness of the LC layer is more uniform, and compared with the prior art, it is possible to eliminate the display defect at the edge of the functional area due to the Notch design, thereby improving the product quality.

Figure 7:
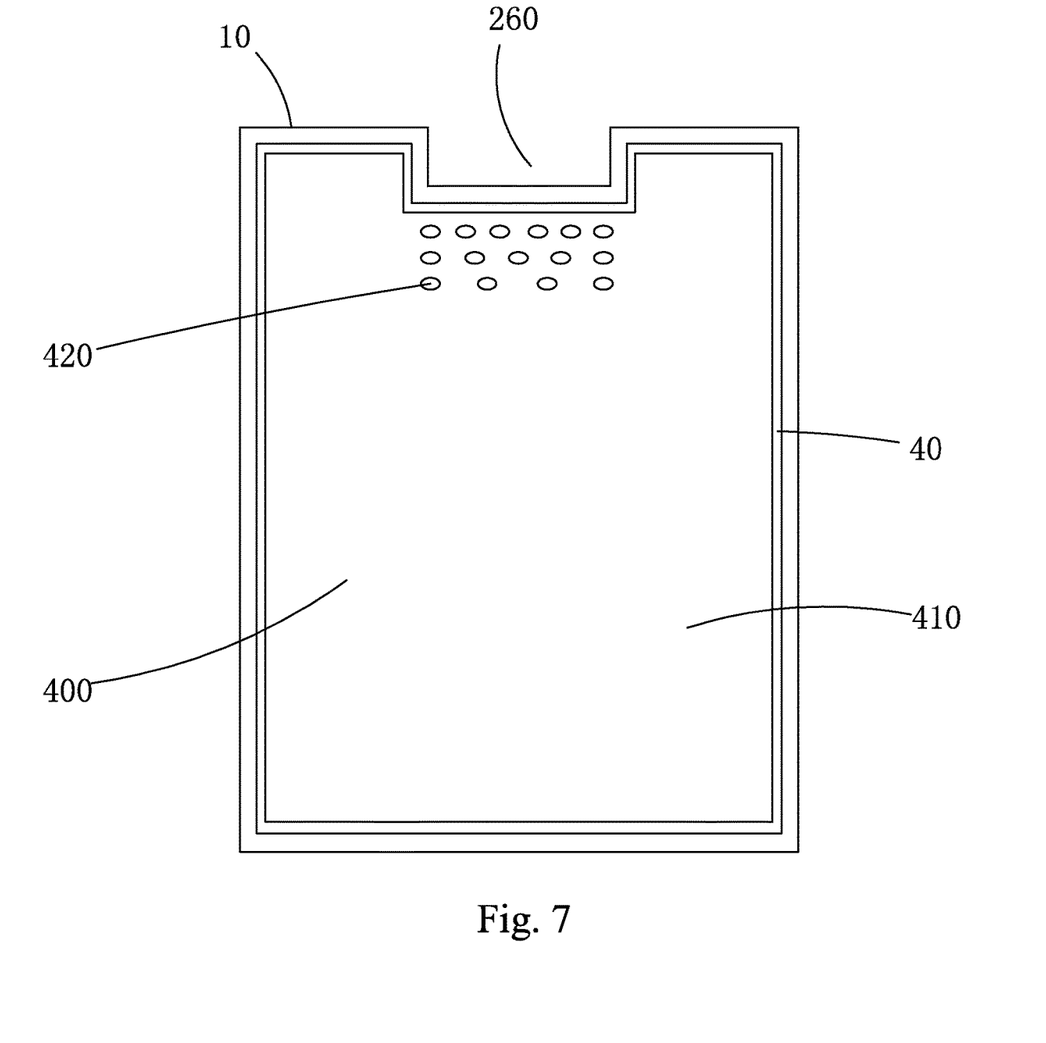
FIG. 7 is a top view showing the TFT array substrate and sealant of the LCD panel of the first embodiment of the present invention.
Figure 8:
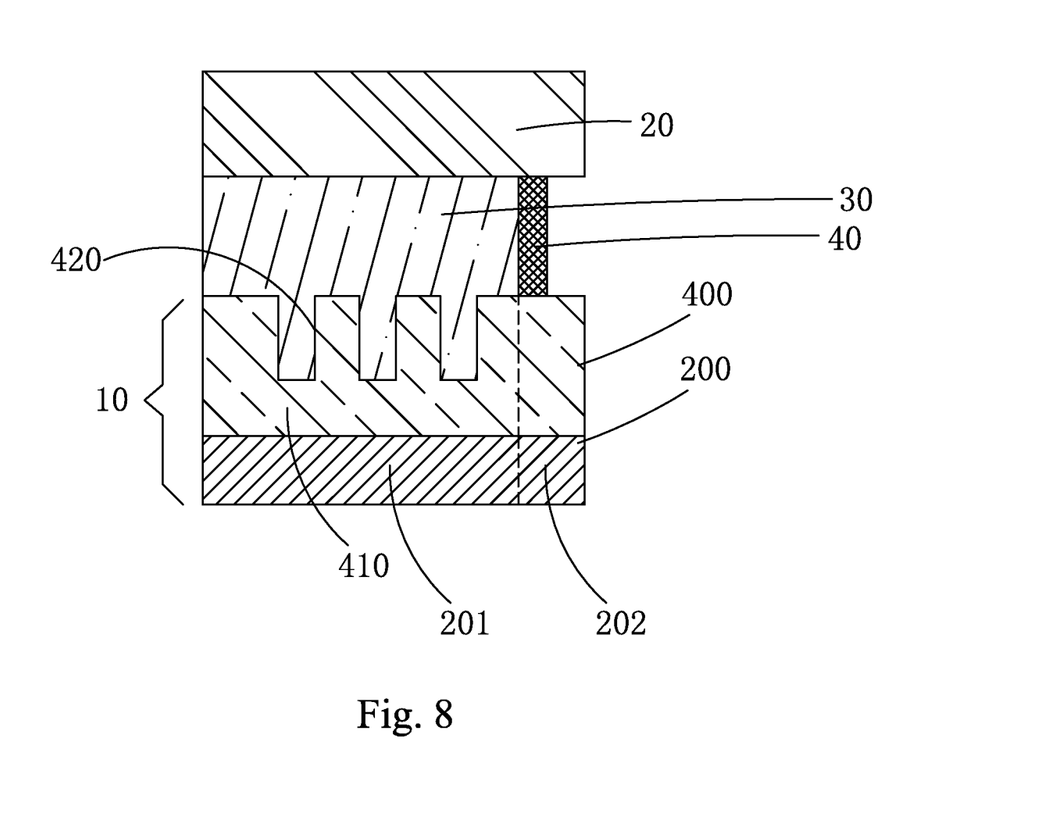
FIG. 8 is a cross-sectional view showing the first portion adjacent to the groove of the LCD panel of the first embodiment of the present invention.

Based on the same concept, referring to FIG. 7 and FIG. 8 as well as FIG. 3, the LCD panel of the first embodiment of the present invention comprises: a TFT array substrate 10 and a CF substrate 20 disposed opposite to each other, an LC layer 30 disposed between the TFT array substrate 10 and the CF substrate 20, and a sealant 40 disposed between the TFT array substrate 10 and the CF substrate 20 and outside of the LC layer 30.

Refer to FIG. 7. The TFT array substrate 10 is the above-mentioned TFT array substrate of the first embodiment, and the detailed description will not be repeated herein.

A portion of the LC layer 30 is housed in the pit 420.

Specifically, the sealant 40 is disposed corresponding to the peripheral area 202. The inner side of the sealant 40 coincides with the edge of the functional area 201, and the outer side of the sealant 40 has a gap with the edge of the TFT array substrate 10.

It should be noted that, referring to FIG. 7 and FIG. 8, when fabricating the LCD panel of the first embodiment of the present invention, the TFT array substrate is paired with the CF substrate and assembled. A sealant frame is formed in corresponding peripheral area 202 between the TFT array substrate and the CF substrate, and the inner side of the sealant coincides with the edge of the functional area 201. LC is injected into the inner side of the sealant between the TFT array substrate and the CF substrate to form an LC layer. Because the base substrate 200 is disposed with the groove 260, the portion of the sealant corresponding to the groove 260 is also bent toward the inner side of the TFT array substrate as the groove 260. Therefore, during the diffusion process, the LC accumulates in the first portion 410 of the planarization layer 400 corresponding to the functional area 201 adjacent to the groove 260. The closer to the groove 260, the more LC is accumulated. In the first embodiment of the TFT array substrate of the present invention, the region of the first portion 410 of planarization layer 400 corresponding to the functional area 201 adjacent to the groove 260 is disposed with at least one pit 420. Specifically, the number of pits 420 per unit area in the region of the first portion 410 adjacent to the groove 260 is greater than the number of pits 420 per unit area in the region of the first portion 410 away from the groove 260. As such, in a cross-section of the planarization layer 400, the area occupied by the pits 420 per unit area where the first portion 410 is disposed with the pits 420 gradually increases towards the direction of the groove 260. Therefore, the accumulated LC can be accommodated by the pits 420, so that the portion of the LC layer 30 of the final LCD panel is accommodated in the pit 420, the thickness of the LC layer 30 is more uniform, and compared with the prior art, it is possible to eliminate the display defect at the edge of the functional area due to the Notch design, thereby improving the product quality.

Figure 9:
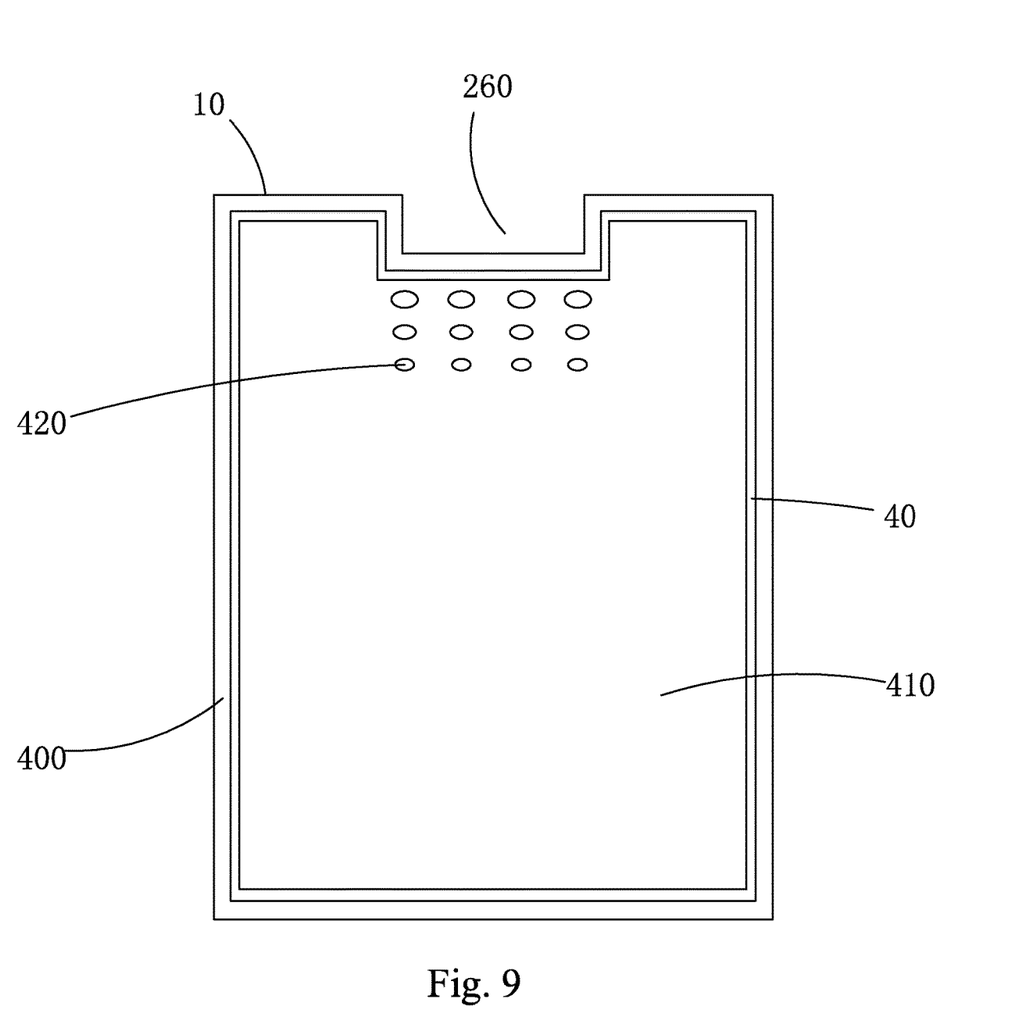
FIG. 9 is a top view showing the TFT array substrate and sealant of the LCD panel of the second embodiment of the present invention.
Figure 10:
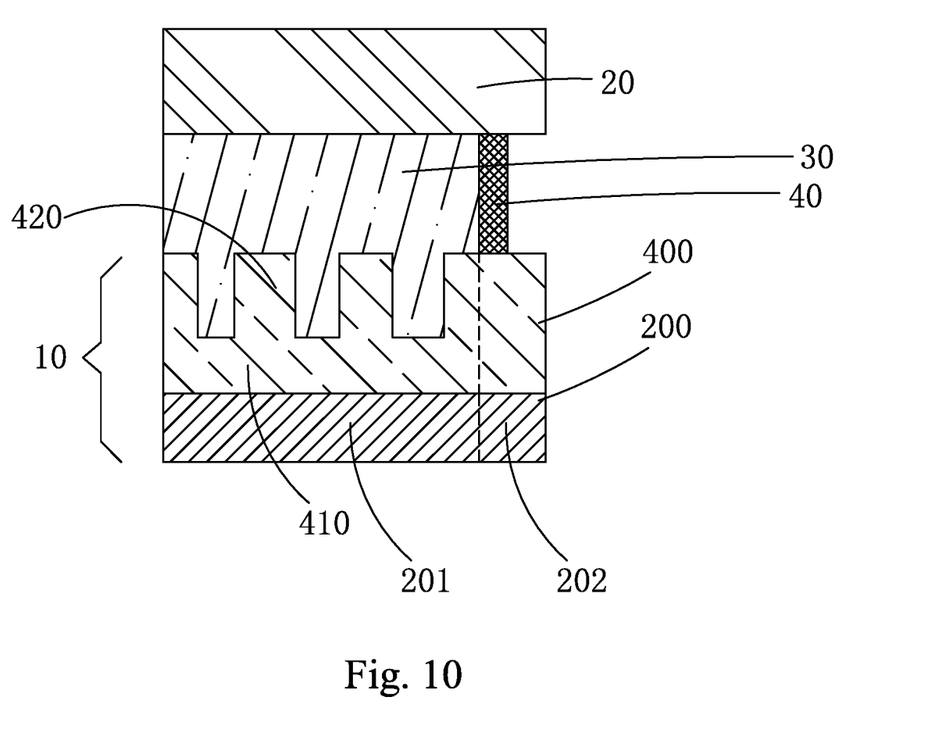
FIG. 10 is a cross-sectional view showing the first portion adjacent to the groove of the LCD panel of the second embodiment of the present invention.

Referring to FIG. 9 and FIG. 10 as well as FIG. 3, the LCD panel of the second embodiment of the present invention differs from the first embodiment in that the TFT array substrate 10 is the TFT array substrate of the second embodiment, and the detailed description will not be repeated herein.

It should be noted that in the TFT array substrate of the second embodiment of the LCD panel of the present invention, the region of the first portion 410 of planarization layer 400 corresponding to the functional area 201 adjacent to the groove 260 is disposed with at least one pit 420 and the inner diameter of the pit 420 in the region of the first portion 410 adjacent the groove 260 is larger than the inner diameter of the pit 420 in the region of the first portion 410 away from the groove 260. As such, in a cross-section of the planarization layer 400, the area occupied by the pits 420 per unit area where the first portion 410 is disposed with the pits 420 gradually increases towards the direction of the groove 260. Therefore, the accumulated LC can be accommodated by the pits 420, so that the portion of the LC layer 30 of the final LCD panel is accommodated in the pit 420, the thickness of the LC layer 30 is more uniform, and compared with the prior art, it is possible to eliminate the display defect at the edge of the functional area due to the Notch design, thereby improving the product quality.

In summary, the TFT array substrate provided by the present invention adopts a Notch design, with a base substrate disposed with a groove at one end. The base substrate comprises a functional area and a peripheral area located outside the functional area, and the planarization layer on the base substrate has a first portion corresponding to the functional area, wherein the first portion adjacent to the groove is provided with at least one pit, and the depth of the pit is smaller than the thickness of the first portion. When the TFT array substrate and the CF substrate are assembled, after the LC is injected between the TFT array substrate and the CF substrate, the LC accumulation generated in the first portion of the planarization layer near the groove during LC diffusion will be in the pit, thereby making the thickness of the LC layer more uniform and improved product quality. The LCD panel provided by the invention has uniform LC layer and high product quality.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. A thin film transistor (TFT) array substrate, comprising: a base substrate and a planarization layer disposed on the base substrate; one end of the base substrate being provided with a groove, the base substrate comprising a functional area and a peripheral area located outside the functional area; the planarization layer has a first portion corresponding to the functional area of the base substrate; a portion of the first portion adjacent to the groove being disposed with at least one pit; the pit having a depth less than the thickness of the first portion; wherein the planarization layer is formed with a notch that corresponds to the groove of the base substrate and the portion of the first portion of the planarization layer is adjacent to the notch, wherein the pit that is formed in the portion of the first portion of the planarization layer is adjacent to the notch of the planarization layer.

2. The TFT array substrate as claimed in claim 1, wherein in a cross-section of the planarization layer, area occupied by the pits per unit area where the first portion is disposed with the pits gradually increases towards the direction of the groove.

3. The TFT array substrate as claimed in claim 2, wherein the number of pits per unit area in region of the first portion adjacent to the groove is greater than the number of pits per unit area in region of the first portion away from the groove.

4. The TFT array substrate as claimed in claim 2, wherein an inner diameter of the pit in the region of the first portion adjacent the groove is larger than an inner diameter of the pit in the region of the first portion away from the groove.

5. The TFT array substrate as claimed in claim 3, wherein the first portion is disposed with N rows of pits adjacent to the groove, and distance between the plurality of pits and the groove in each row of pits is the same, wherein N is a positive integer;
    spacing between two adjacent pits in each row of pits is equal.

6. The TFT array substrate as claimed in claim 5, wherein $3 \leq N \leq 5$.

7. The TFT array substrate as claimed in claim 1, wherein the depth of the pit is 0.5-3 um.

8. The TFT array substrate as claimed in claim 1, wherein the end of the base substrate disposed with the groove comprises a first sidewall, a second sidewall, a third sidewall, a fourth sidewall and a fifth sidewall, sequentially connected; the first sidewall and the fifth sidewall are in the same plane, the second sidewall, the third sidewall, and the fourth sidewall collectively form the groove.

9. The TFT array substrate as claimed in claim 8, wherein the first sidewall is perpendicular to the second sidewall, the second sidewall is perpendicular to the third sidewall, and the third sidewall is perpendicular to the fourth sidewall.

10. A liquid crystal display (LCD) panel, comprising: a TFT array substrate as claimed in claim 1 and a CF substrate disposed opposite to each other, and an LC layer disposed between the TFT array substrate and the CF substrate;
    a portion of the LC layer being housed in the pit.

* * * * *